US012563698B1

(12) United States Patent
Conti Garcia

(10) Patent No.: US 12,563,698 B1
(45) Date of Patent: *Feb. 24, 2026

(54) APPLIANCE IMMERSION COOLING SYSTEM

(71) Applicant: Midas Green Technology, LLC, Austin, TX (US)

(72) Inventor: Mario Conti Garcia, Austin, TX (US)

(73) Assignee: Midas Green Technology, LLC, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/234,842

(22) Filed: Jun. 11, 2025

Related U.S. Application Data

(62) Division of application No. 18/924,608, filed on Oct. 23, 2024, now Pat. No. 12,336,142.

(51) Int. Cl.
H05K 7/20 (2006.01)
*G06F 1/20* (2006.01)

(52) U.S. Cl.
CPC ..... H05K 7/20272 (2013.01); H05K 7/20236 (2013.01); *G06F 1/20* (2013.01); *H05K 7/203* (2013.01); *H05K 7/20327* (2013.01); *H05K 7/20781* (2013.01)

(58) Field of Classification Search
CPC ........... H05K 7/20272; H05K 7/20236; H05K 7/20327; H05K 7/203; H05K 7/20781; G06F 1/20
USPC .......................................................... 165/58
See application file for complete search history.

(56) References Cited

U.S. PATENT DOCUMENTS

| | | | | |
|---|---|---|---|---|
| 10,820,446 | B2 * | 10/2020 | Boyd ................. | H05K 7/20236 |
| 2011/0132579 | A1 | 6/2011 | Best et al. | |
| 2014/0211412 | A1 | 7/2014 | Best | |
| 2020/0383237 | A1 * | 12/2020 | Hashimoto ........ | H05K 7/20272 |
| 2022/0104394 | A1 * | 3/2022 | Boyd ................. | H05K 7/20272 |
| 2022/0330459 | A1 * | 10/2022 | Chen ................. | H05K 7/20272 |

FOREIGN PATENT DOCUMENTS

WO          2019006437 A1          1/2019

* cited by examiner

*Primary Examiner* — Joel M Attey
(74) *Attorney, Agent, or Firm* — K&L Gates LLP

(57) ABSTRACT

An immersion cooling system comprising a tank module couplable to a plurality of cooling distribution modules. The cooling distribution modules circulate a dielectric fluid into the tank module allowing the dielectric fluid to extract heat from a plurality of electrical appliances. The cooling distribution modules are configured to operate in a fault tolerance environment.

17 Claims, 8 Drawing Sheets

Fig. 4

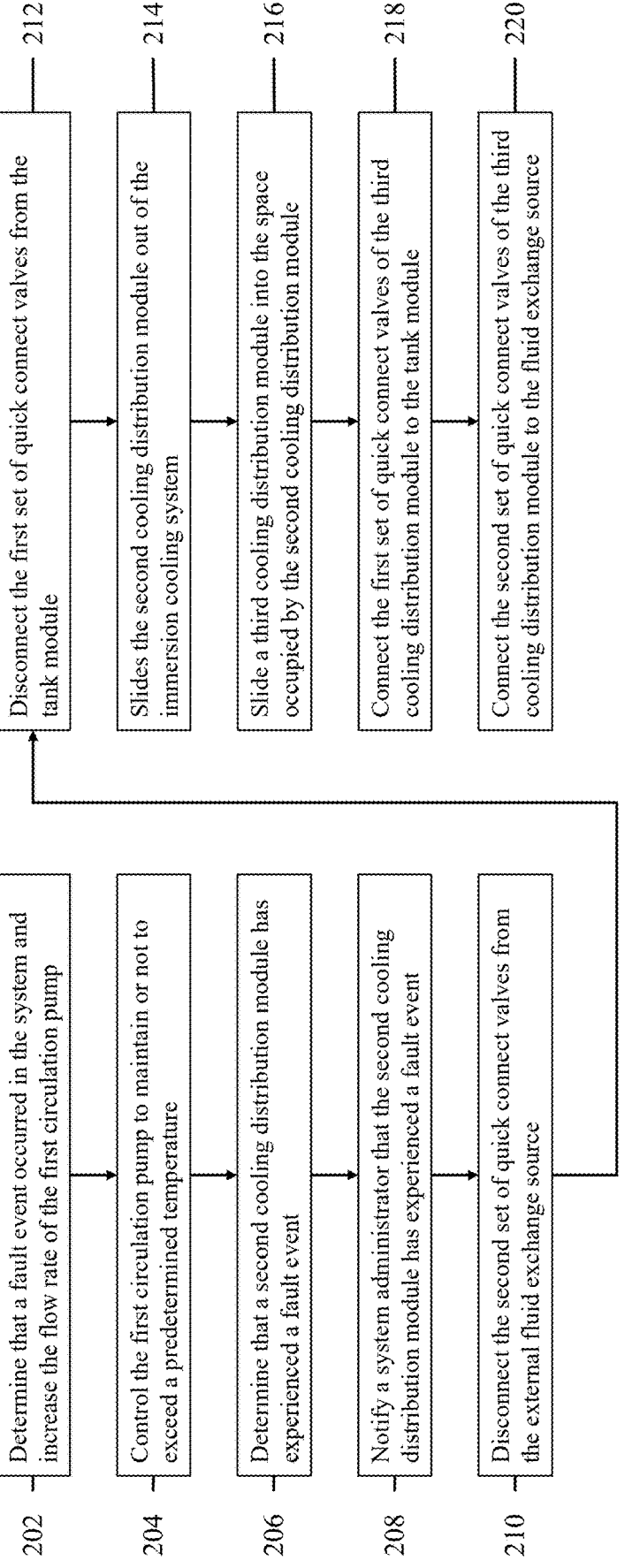

200

202 — Determine that a fault event occurred in the system and increase the flow rate of the first circulation pump 204 — Control the first circulation pump to maintain or not to exceed a predetermined temperature 206 — Determine that a second cooling distribution module has experienced a fault event 208 — Notify a system administrator that the second cooling distribution module has experienced a fault event 210 — Disconnect the second set of quick connect valves from the external fluid exchange source 212 — Disconnect the first set of quick connect valves from the tank module 214 — Slides the second cooling distribution module out of the immersion cooling system 216 — Slide a third cooling distribution module into the space occupied by the second cooling distribution module 218 — Connect the first set of quick connect valves of the third cooling distribution module to the tank module 220 — Connect the second set of quick connect valves of the third cooling distribution module to the fluid exchange source

Fig. 8

APPLIANCE IMMERSION COOLING SYSTEM

PRIORITY CLAIM

This application is a divisional of U.S. patent application Ser. No. 18/924,608, filed Oct. 23, 2024, titled "APPLIANCE IMMERSION COOLING SYSTEM," which is incorporated by reference herein in its entirety.

CROSS-REFERENCE TO RELATED APPLICATIONS

The subject application is related to design patent application Ser. No. 29/968,868, filed Oct. 18, 2024.

BACKGROUND

The subject matter described herein relates to an immersion cooling system comprising a tank module couplable to a plurality of cooling distribution modules. The immersion cooling system circulates a dielectric fluid throughout the tank module allowing the dielectric fluid to extract heat from a plurality of electrical appliances in the tank.

SUMMARY

In one aspect, the present invention is directed to an immersion cooling system that comprises a plurality of cooling distribution modules (preferably two cooling distribution modules) configurable in a fault tolerant environment. In various embodiments, the immersion cooling system may operate at full capacity with only one cooling distribution module. For example, a first cooling distribution module may operate as an active unit (e.g., maintaining or not exceeding a predetermined dielectric fluid temperature) while a second or third cooling distribution module operates as a standby unit. The standby unit may be in a low power state until it receives a control signal to initiate a failover sequence that switches the operational status from standby to active. The control signal may be based on a signal sent from another device such as the tank module or another cooling distribution module, or based on a detected fault event, such as by the standby unit, from a temperature sensor or a flow sensor. The lack of a signal can also be used as a control signal. In another example, a first cooling distribution module may operate a circulation pump at less than full capacity (e.g., 90% of the maximum pump circulation volume or flow rate for the first cooling distribution module) while a second cooling distribution module operates a circulation pump less than full capacity (e.g., 20% of the maximum pump circulation volume or flow rate of the second cooling distribution module). The flow rates may be dynamically controlled based on the number of cooling distribution modules in the system, the number of electrical appliances in the tank module, and/or the temperature of the dielectric fluid. If an active unit fails or undergoes a fault event, the standby unit may initiate a failover sequence and switch to an active operational status. A system administrator may swap the failed cooling distribution module with a replacement unit allowing the system to maintain redundancy. The cooling distribution modules may also comprise a plurality of quick connect valves allowing for fast and convenient replacement of the failed cooling distribution module without spilling the dielectric fluid in a data center.

An immersion cooling system according to various embodiments of the present invention can be concurrently maintainable by allowing the plurality of cooling distribution modules to be in an isolated configuration from the tank module. The isolated configuration creates a fault tolerant system that allows faulty cooling distribution modules to be quickly replaced in a hot swappable manner. Additionally, the isolated configuration allows for maintenance to be performed outside of the production area, while the system operates with a plurality of redundant cooling distribution modules. This allows for non-specialized technicians to replace the faulty cooling distribution modules instead of repairing the units in the production area. This also eliminates the need of monthly test procedures and keeps production areas clean of fluids. The isolated configuration may further provide an adjustable level of uptime by adjusting redundancy levels (N, N+1, N+n, 2N, 2N+1, 2N+n, nN, nN+n, etc.) These and other benefits that can be realized through embodiments of the present invention will be apparent from the description that follows.

BRIEF DESCRIPTION OF THE DRAWINGS

Various embodiments of the present invention are described herein by way of example in conjunction with the following figures.

FIG. 4 shows a cutaway back view of the tank module, comprising two sets of connection lines for a first cooling distribution module and a second cooling distribution module, according to at least one embodiment of the present invention.

FIG. 8 shows a method for replacing a faulty cooling distribution module in an immersion cooling system, according to at least one embodiment of the present invention.

DETAILED DESCRIPTION

Figure 1:
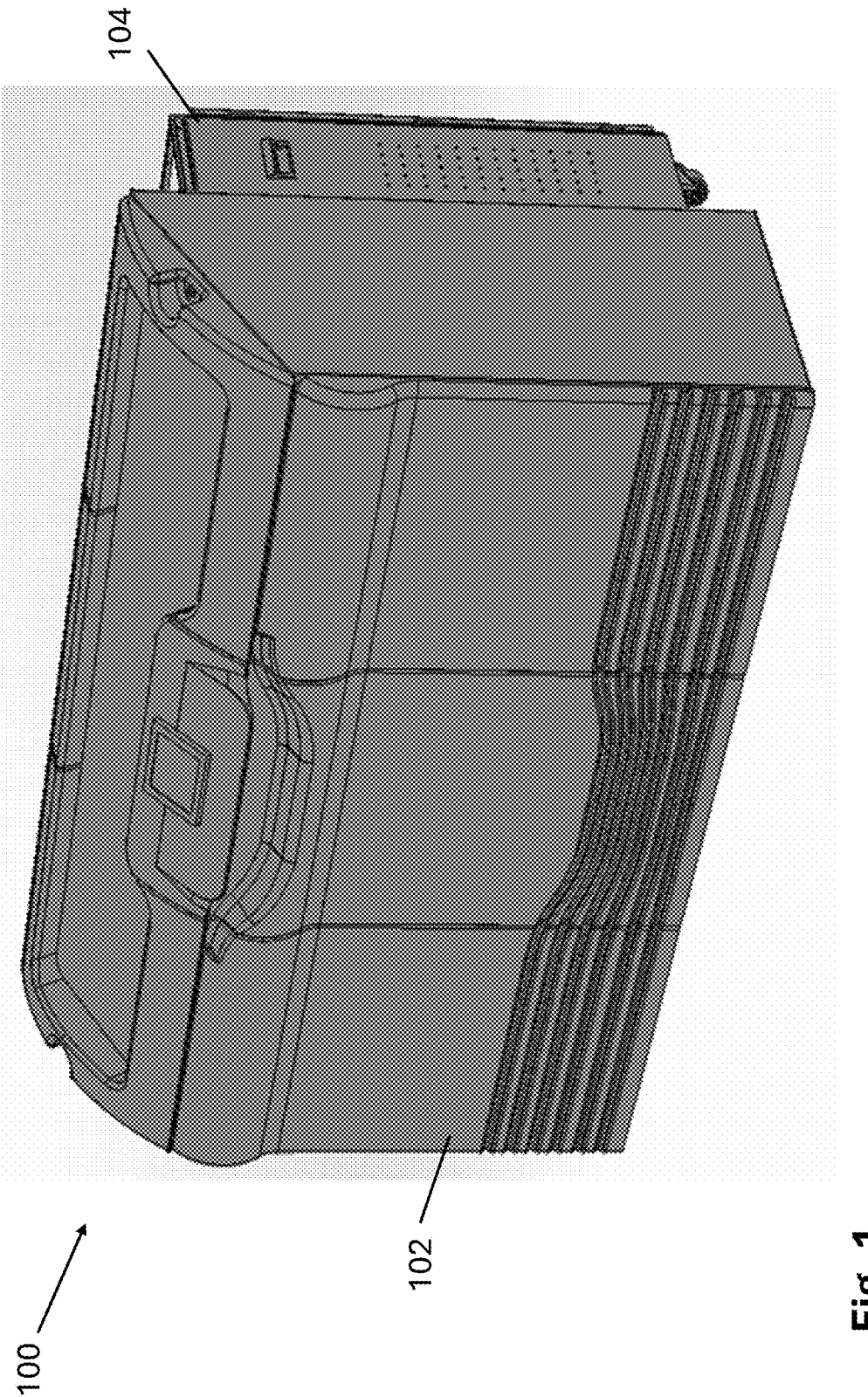
FIG. 1 shows an immersion cooling system comprising a tank module coupled to a first cooling distribution modules of a plurality of cooling distribution modules, according to at least one aspect of the present invention.
Figure 5:
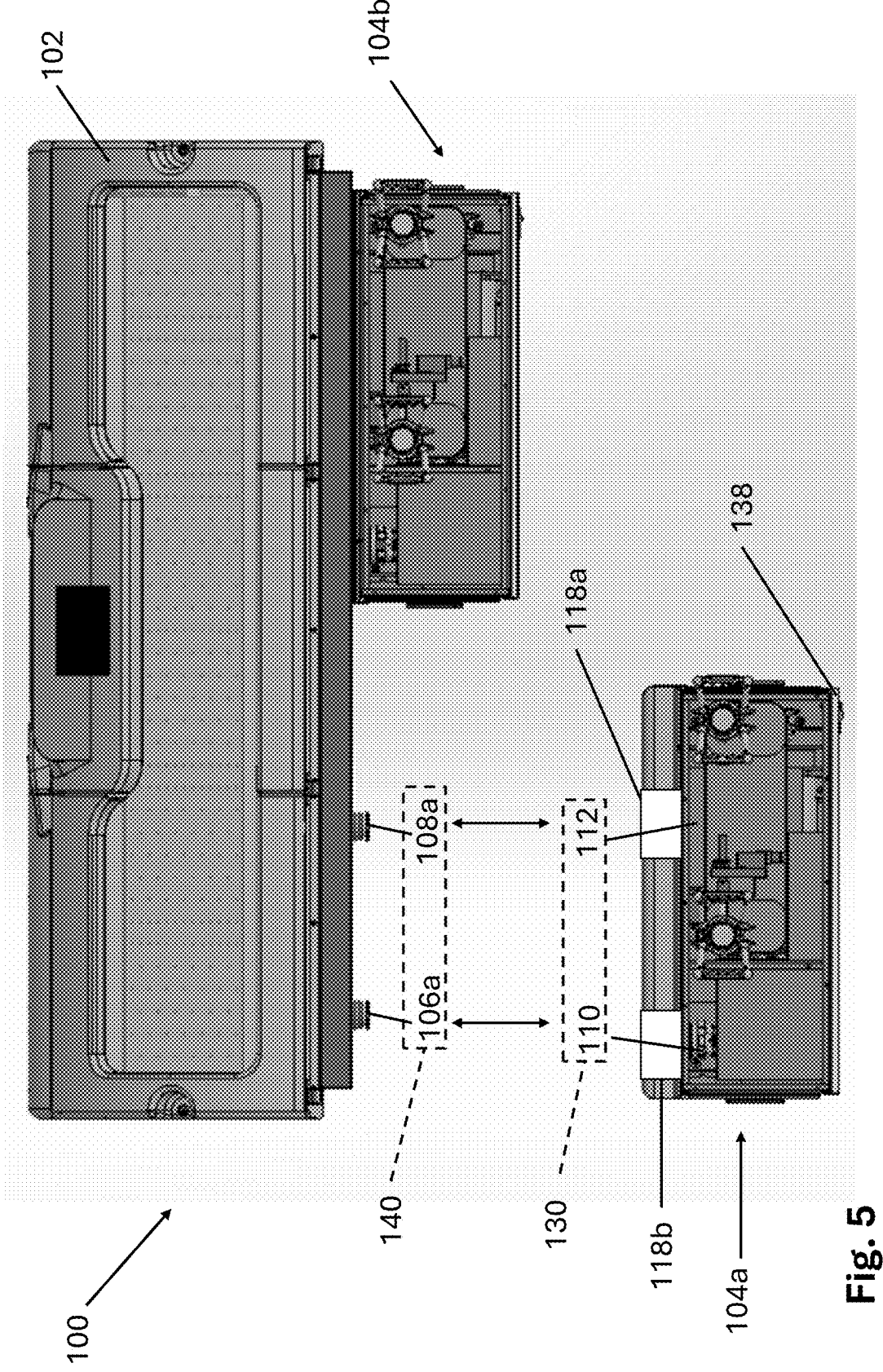
FIG. 5 shows a top view of the immersion cooling system comprising a first cooling distribution module disconnected from the tank module and a second cooling distribution module connected to the tank module, according to at least one embodiment of the present invention.

FIG. 1 shows an immersion cooling system 100 according to various embodiments of the present invention. The depicted, example immersion cooling system 100 comprises a tank module 102 simultaneously coupled to a plurality (e.g., two) cooling distribution modules 104. FIG. 5 is a top view of the immersion cooling system 100 showing two cooling distribution modules 104a-b side-by-side and connected to the tank module. As example herein, the cooling distribution modules 104 are swappable so that the tank module 102 is preferably not powered down or powered down for only a short period of time when one of the cooling distribution modules 104 is swapped for another one. In the event that the tank module 102 is powered down, the period of time that the tank module 102 is powered down to replace a cooling distribution module is less than the amount of time that it would take for the thermal mass of the dielectric fluid to exceed a predetermined temperature. The tank module 102 can hold a dielectric fluid in which a plurality of electrical appliances can be immersed. The electrical appliances could be, for example, circuit boards, servers, power distribution units, batteries, etc. Each of the plurality of electronic appliances may be disposed in an appliance slot in the tank module 102 or associated with an appliance position in the tank module 102 or otherwise placed into the tank module 102. The dielectric fluid in the tank module 102 circulates (e.g., uniformly) throughout the tank module 102 to extract heat from the plurality of electrical appliances.

Figure 2:
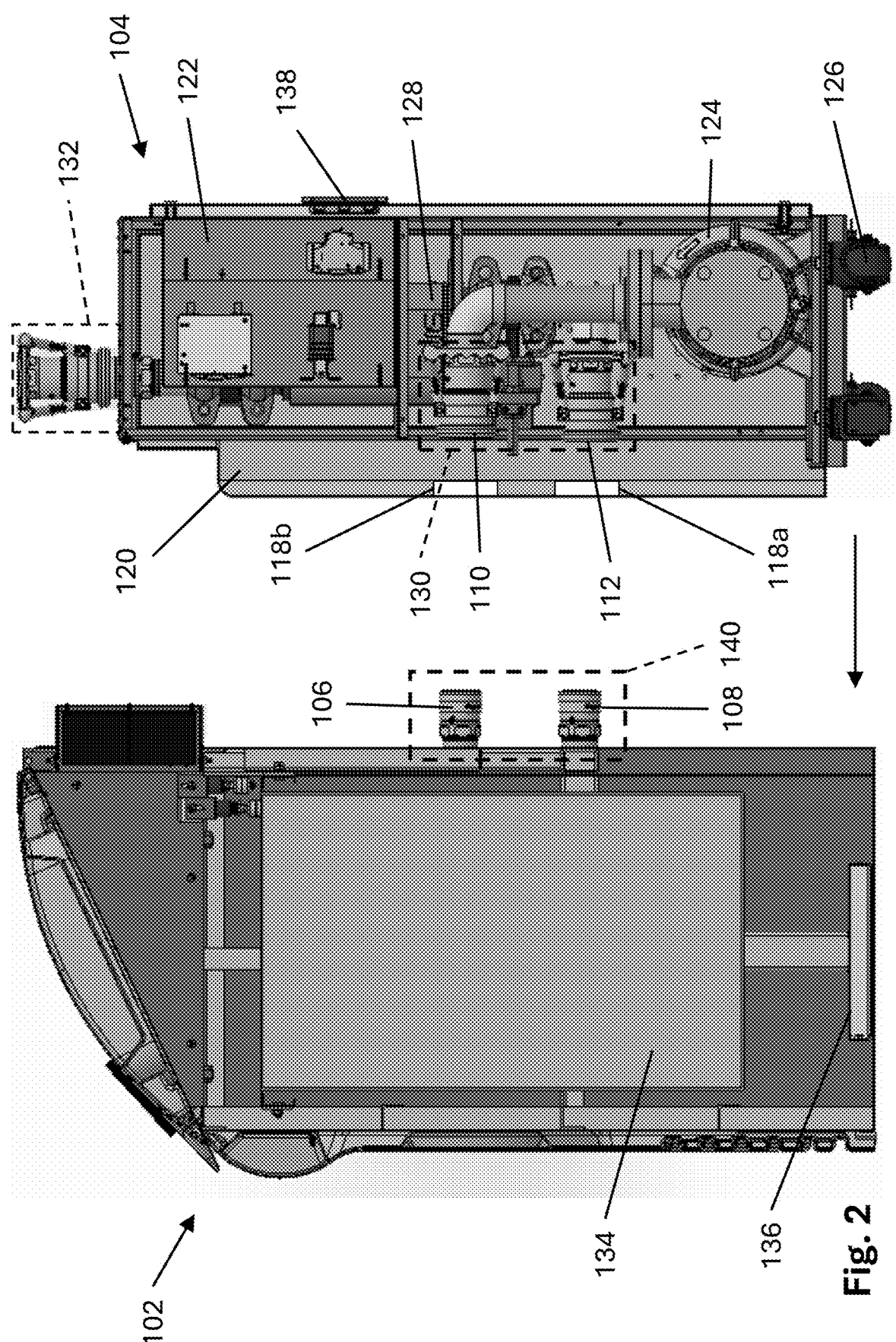
FIG. 2 shows a side view of the immersion cooling system comprising the tank module disconnected from the plurality of cooling distribution modules, according to at least one embodiment of the present invention.

FIG. 2 shows a side view of the immersion cooling system 100 comprising the tank module 102 disconnected from a first cooling distribution module 104, according to one exemplary embodiment of the present invention. The tank module 102 comprises a tank 134a plenum 136, a control circuit (not shown), and a plurality of connection lines 132 comprising a supply line 108, and a return line 106. The tank 134 may comprise one or more tanks within the tank module 102. In various embodiments, the control circuit comprises a memory coupled to a processor and is configurable to receive, transmit, and execute commands. The tank 134 further comprises the plurality of electronic appliance slots or appliance positions. The plenum 136 may be positioned adjacent the bottom of the tank 102 and adapted to dispense the dielectric fluid substantially uniformly upwardly through each appliance slot or appliance position. When the cooling distribution module 104 is connected to the tank module 102, the tank module 102 receives the dielectric fluid from the cooling distribution module 104 at a supply line 108 and provides the dielectric fluid to the cooling distribution module through the return line 106, once the fluid circulates through the tank 134 and extracts heat from the plurality of electronic appliance. When the cooling distribution module 104 is disconnected from the tank module 102, the plurality of connection lines 140, on the tank module, are configurable to seal so as to not allow dielectric fluid (or at least only a very small amount of dielectric fluid) in the tank 134 to run or leak out of the tank 134 as explained herein.

FIG. 2 further shows a cutaway view of the cooling distribution module 104, showing that in various embodiments the cooling distribution module may comprise an enclosure or housing 120, a first control circuit 122, a circulation pump 124, a plurality of wheels or casters 126, a heat exchanger 128, a first set of quick connect valves 130, and a second set of quick connect valves 132. The first set of quick connect couplings 130 may further comprise a supply valve 112 and a return valve 110. The cooling distribution module 104 may comprise a rolling mechanism (e.g., wheels or casters) to roll or slide on the cooling distribution module 104 towards the tank module 102. The supply line 108 may pass through a first inlet hole 118a in the enclosure 120 and connect with the supply valve 112, and the return line 106 may pass through a second inlet hole 118b in the enclosure 120 and connect with the return valve 110. The components of the cooling distribution module 104 (e.g., first control circuit 122, circulation pump 124, heat exchanger) are situated within the enclosure 120 to minimize the number of bends that decreases flow restriction and increases the energy efficiency of the system. Additionally, the second set of quick connect couplings 132 are in close proximity to the heat exchanger and minimizes the run distance. The cooling distribution modules 104 are swappable as explained herein. Accordingly, all of the cooling distribution modules (e.g., modules 104a-b in FIG. 5) are preferably configured in the same way so that they can all easily connect to the tank module 102.

In various aspects, the supply valve 112 and the return valve 110 may be horizontally disposed, relative to the ground surface, and in parallel vertically (i.e., one about the other) allowing the supply line 108 and the return line 106 to simultaneously connect to the supply valve 112 and the return valve 110, when the cooling distribution module 104 slides into place. The second set of quick connect couplings 132 (see also FIG. 6) may be connected to a secondary fluid exchange source (e.g., radiator, water exchange source). The second set of quick couplings valves 132 may be vertically disposed, in parallel (e.g., one to the right of the other), and connectable with the secondary fluid exchange source, after establishing a connection with the tank module 102 with the first set of quick connect couplings 130. The heat exchanger 128 may be configured to extract heat from the dielectric cooling fluid. In one embodiment, the heat exchanger 128 may receive untreated dielectric fluid (e.g., hot) from the tank module 102 and, a second fluid (e.g., water or coolant that does not mix with the dielectric fluid) from the secondary fluid exchange source connected to the second set of quick connect couplings 132. The heat exchanger extracts the heat from the untreated dielectric fluid and transfers heat to the second fluid allowing the cooling distribution module to provide the treated dielectric fluid (e.g., cooled) to the tank module through the supply line 108.

The first control circuit 122 may be configured to communicate with the control circuit of tank module through a wired (e.g., Ethernet cables, CAN Bus, RS-485, RS-232) or wireless (e.g., Zigbee) connection. The first control circuit 122 may control the flow rate of the circulation pump in the cooling distribution module 104. The circulation pumps in the cooling distribution modules 104 control the flow of the dielectric fluid throughout the immersion cooling system 100. Therefore, a plurality of circulation pumps corresponding to each of the plurality of cooling distribution modules 104 creates redundancy in the event one of the circulation pumps fail. The first control circuit 122 may set different flow rates for different cooling distribution modules depending on the connection location of the cooling distribution modules and number of cooling distribution modules 104 connected to the tank module. The immersion cooling system 100 may be configured as a fault tolerant system where the failure of at least one circulation pump does not impact the operation of immersion cooling system 100. For example, a flow sensor may be configured to determine that a circulation pump has failed. The first control circuit 122 may be configured to receive a feedback signal to change the flow rate of an operational circulation pump to compensate for the change in system flow rate of the dielectric fluid. The circulation pump 124 may be situated within the cooling distribution module, where the circulation pump 124 is easily accessible through a back panel 138 of the enclosure 120 for maintenance and replacement. In another example, different non-zero flow rates may be set for different cooling distribution modules that circulate the dielectric fluid from the cooling distribution modules to the tank module.

It should be noted that other configurations for the tank module 102 and the cooling distribution modules 104 besides those shown in FIG. 2.

Figure 3:
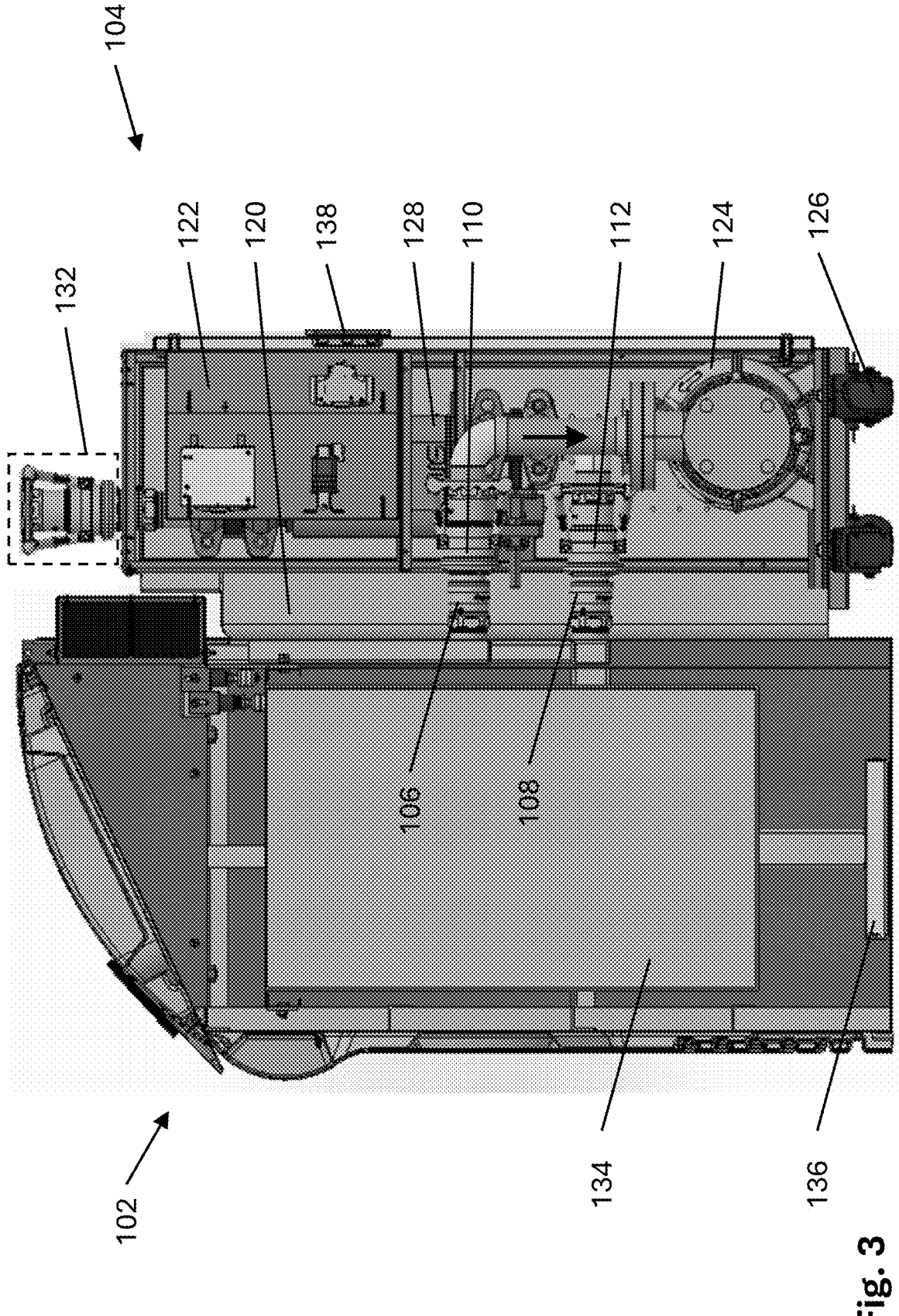
FIG. 3 shows a side view of the immersion cooling system comprising the tank module and a cutaway view of a first cooling distribution module connected to the tank module, at the supply valve and the return valve, according to at least one embodiment of the present invention.

FIG. 3 shows a side view of the immersion cooling system 100 comprising the tank module 102 and a cutaway view of the first cooling distribution module 104 connected to the tank module 102, at the supply valve 112 and the return valve 110, according to at least one embodiment of the present invention. In one embodiment, one or more points of contact (e.g., a system administrator may refer to one or more system administrators and a technician may refer to one or more technicians) may receive a notification through a communication medium (e.g., email, text, infrastructure management software, phone call, voice message) from the control circuit of the tank module 102 or the first control circuit 122, that there is a failure event associated with a cooling distribution modules 104 in specific connection location. First, the point of contact may disconnect the second set of quick connect couplings 132, followed by the first set of quick connect couplings 130. The first set of quick connect couplings 130 may be disconnected by opening the back panel 138 of the enclosure 120 and releasing a connection latch. When the quick connect couplings are released, the valves may be configured to seal and prevent the release of the dielectric fluid from the first set of quick connect couplings 130 or the second fluid from the second set of quick connect couplings 132. The party that receives the notification of the failure event may be a different party that reports to the datacenter to resolve the failure event.

Figure 4:
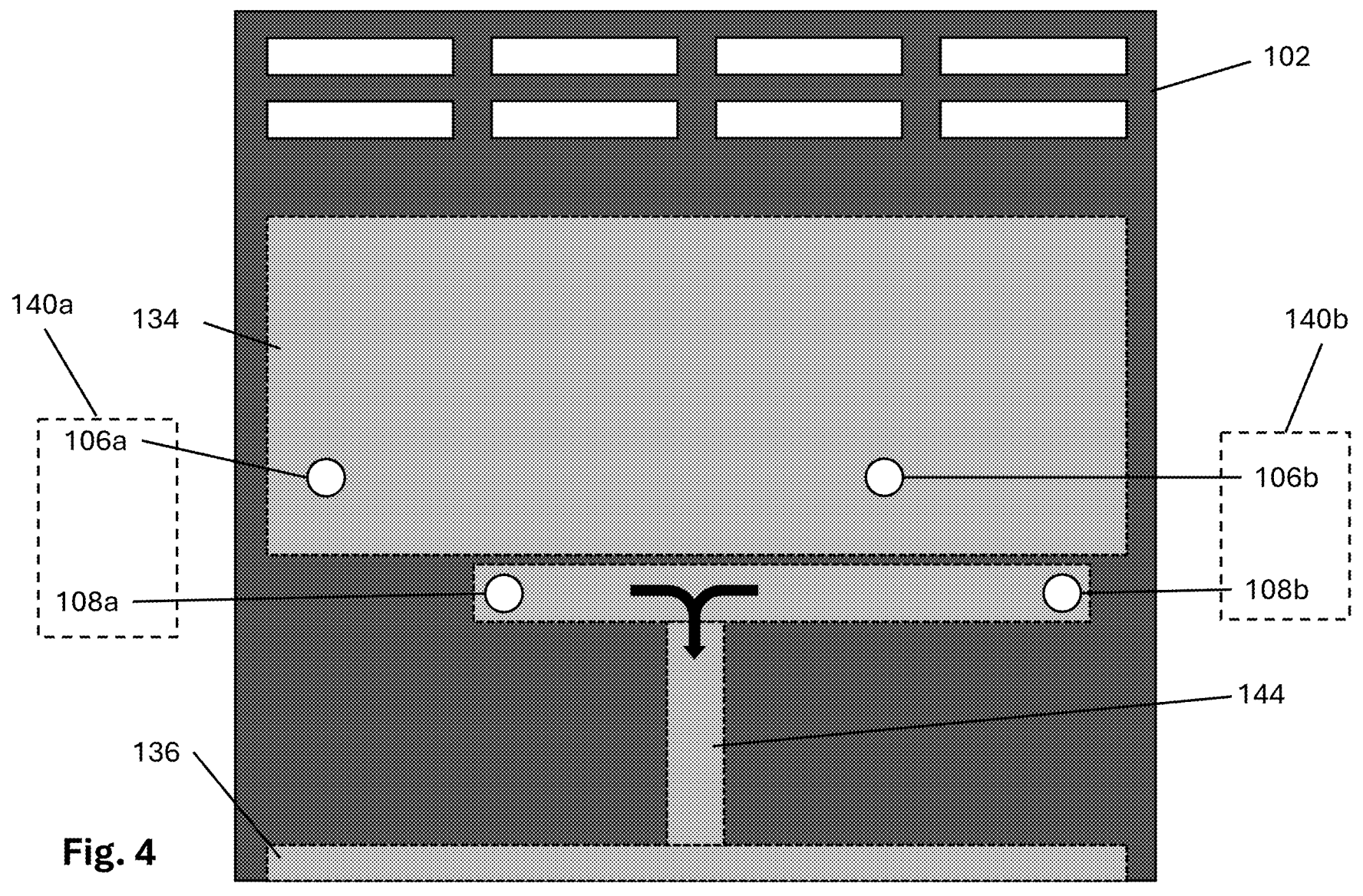

FIG. 4 shows a cutaway back view of the tank module 102, comprising two sets of connection lines for a first cooling distribution module 104 and a second cooling distribution module 104b (see FIG. 5), according to at least one embodiment of the present invention. The first set of connection lines 140a may be associated with a first connection location and the second set of connection lines 140b may be associated with a second connection location. The first set of connection lines 140a comprises a first supply line 108a and a first return line 106a, and the second set of connection lines 140b comprises a second supply line 108b and a second return line 106a. The connection lines and the quick connect couplings may be dry disconnect valves configurable to seal the connection on the tank module side and/or the cooling distribution module side, when the cooling distribution modules are disconnected. The connection lines and the quick connect couplings may automatically seal (e.g., spring loaded dry release coupler) when the connections are released between the quick connect couplings and connection lines or may be manually sealed (e.g., quarter turn ball valve) prior to the release of the quick connect couplings. In one example, the dielectric fluid is received through the first supply line 108a and the second supply line 108b, converges at a down line 144, and is distributed to the electronic appliance slots or appliance positions through the plenum 136. In another example, the dielectric fluid is received through the first supply line 108a and the second supply line 108b, and is individually routed to the plenum 136 where the dielectric fluid converges and is distributed to the electronic appliance slots.

FIG. 5 shows a top view of the immersion cooling system 100 comprising a first cooling distribution module 104 disconnected from the tank module 102 and a second cooling distribution module 104b connected to the tank module 102, according to at least one embodiment of the present invention. Each of the cooling distribution module 104 comprises inlet holes 118a-b that allow the set of connection lines 140 to pass through the enclosure 120 and connect the supply valve 112 and return valve 110 to the tank module 102. When the connections are established, the lines between the cooling distribution module 104b and the tank module 102 are opened to allow the dielectric medium to pass between. The first set of quick connect couplings 130 may be horizontally disposed, in parallel, where the supply valve 112 provides the treated dielectric fluid (e.g., cool side) to the supply line 108a of the tank module 102 and the return valve 110 provides a return path for the untreated dielectric fluid (e.g., hot side) from the return line 108a of the tank module 102.

Figure 6:
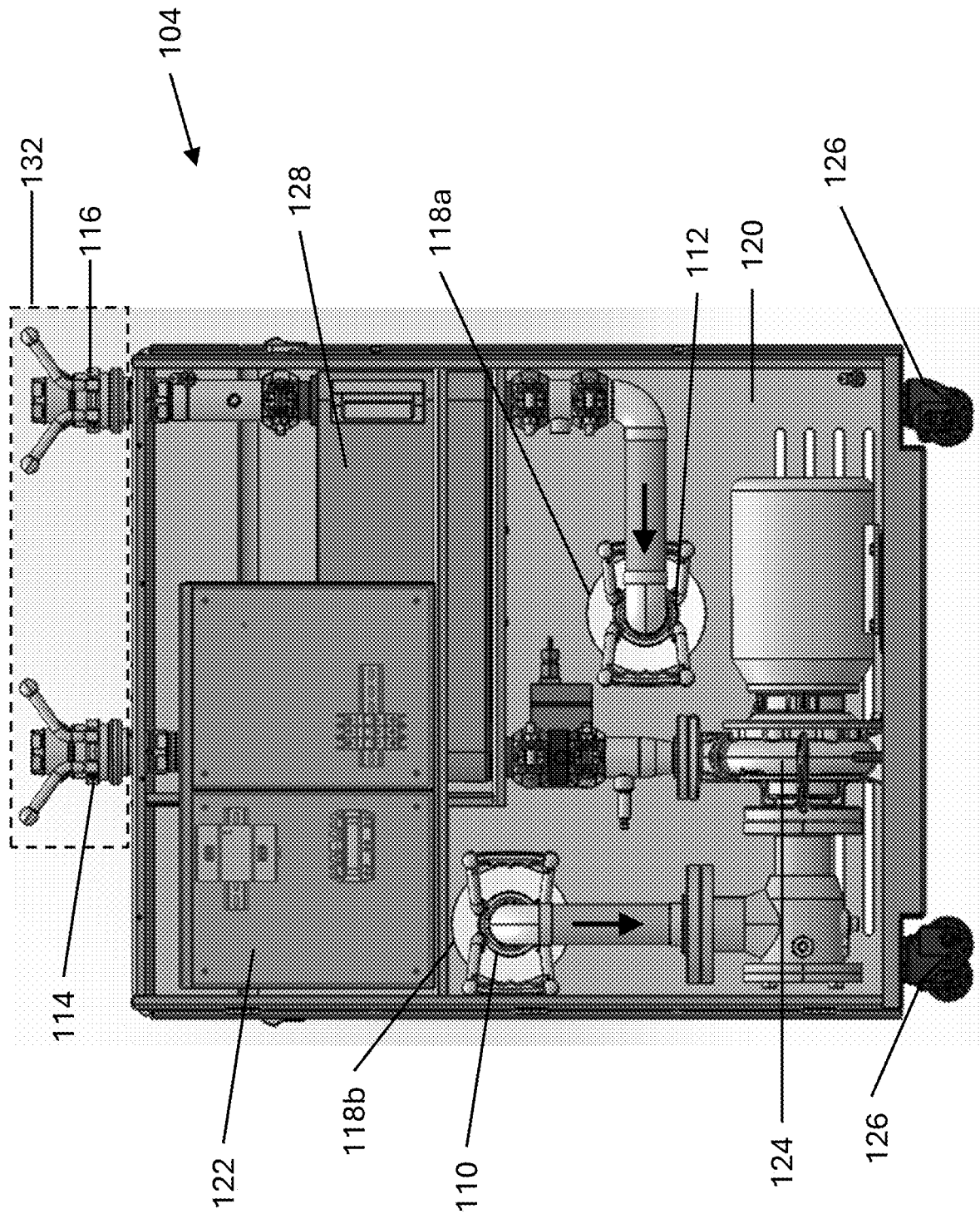
FIG. 6 shows a back view of the cooling distribution modules with the back panel removed, according to at least one embodiment of the present invention.
Figure 7:
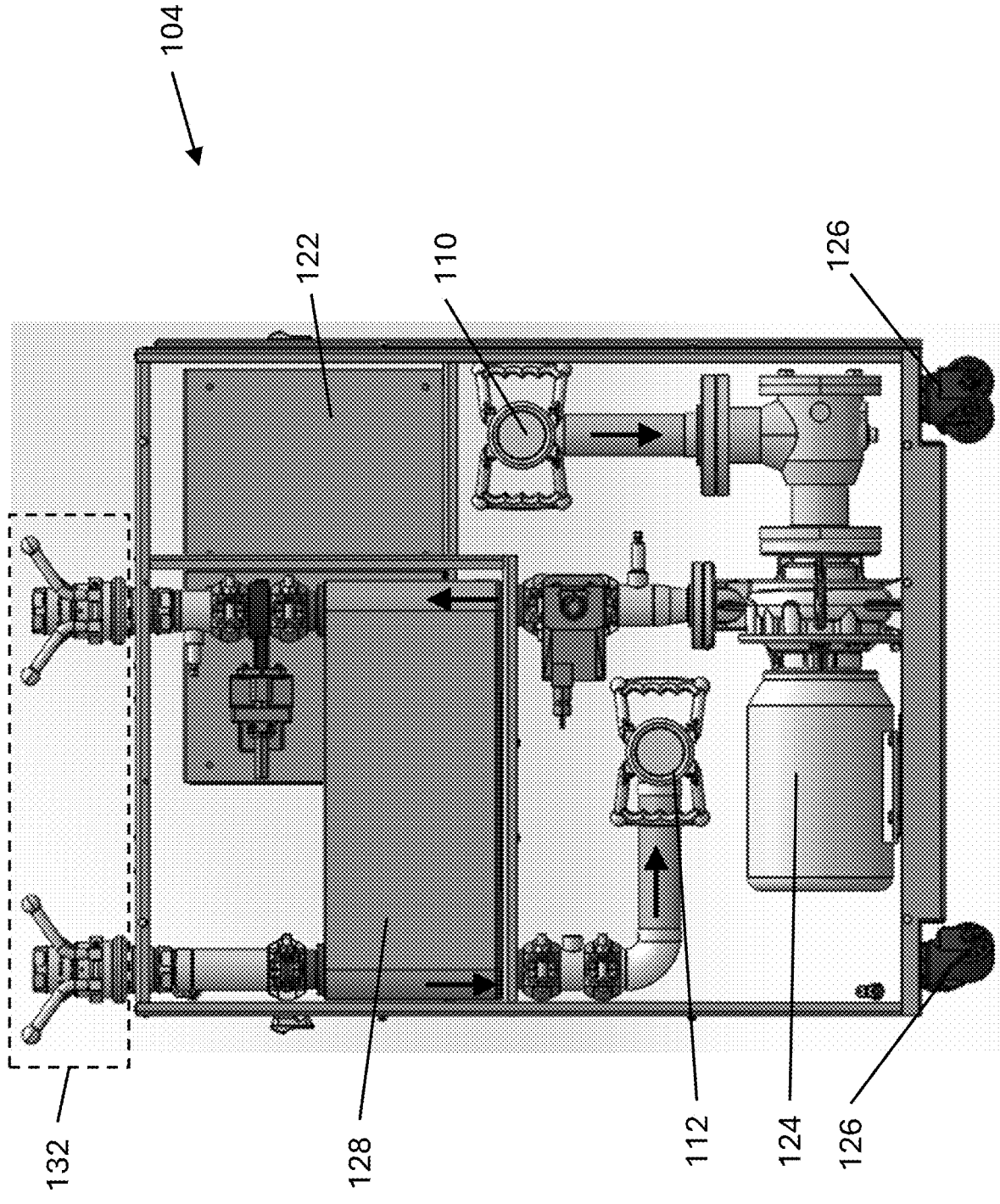
FIG. 7 shows a back view of the cooling distribution module with the front panel and the back panel removed, according to at least one embodiment of the present invention.

FIG. 6 shows a back view of a cooling distribution module 104 with the back panel 138 removed, and FIG. 7 shows a back view of the cooling distribution module 104 with the front panel and the back panel 138 removed, according to at least one embodiment of the present invention. The cooling distribution modules 104 are configured as a modular system where the components can be easily removed and replaced, including the heat exchanger 128, the first control circuit 122, and the circulation pump 124.

FIG. 8 shows a method 200 for replacing a faulty cooling distribution module 104 in an immersion cooling system 100, according to at least one embodiment of the present invention. The first cooling distribution module determines, at step 202, that a fault event occurred and increases the flow rate for the first circulation pump at the first cooling distribution module. The first cooling distribution module controls, at step 204, the first circulation pump to maintain or not to exceed a predetermined temperature of the untreated dielectric fluid. The immersion cooling system 100 determines, at step 206, that a second cooling distribution module 104b has experienced a fault event. The immersion cooling system 100 notifies, at step 208, a system administrator that the second cooling distribution module 104a has experienced a fault event. The system administrator disconnects, at step 210, the second set of quick connect couplings 132 from the external fluid exchange source, where the connection lines of the secondary fluid exchange source are sealed and the second set of quick connect couplings 132 are sealed to prevent the loss of a second cooling fluid. The system administrator disconnects, at step 212, the first set of quick connect couplings 130 from the tank module 102, where the connection lines of the tank module 102 are sealed and the first set of quick connect couplings 130 are sealed to prevent the loss of a dielectric fluid. The system administrator removes (e.g., slides, rolls, etc.), at step 214, the second cooling distribution module 104b out of the immersion cooling system 100, allowing for a replacement unit to be added into the system. The system administrator then moves (e.g., slides, rolls, etc.), at step 216, a third cooling distribution module 104c into the space previously occupied by the second cooling distribution module 104b. The system administrator connects, at step 218, the first set of quick connect couplings 130 of the third cooling distribution module 104c to connection lines 140 of the tank module 102, where the first set of quick connect couplings 130 comprise supply valve and a return valve that are horizontally disposed in parallel allowing the supply valve and the return valve to be simultaneously connected to the tank module 102. The first set of quick connect couplings 130 and the connection lines 140 are unsealed allowing the dielectric fluid to flow between the tank module and the third cooling distribution unit 104c. The system administrator connects, at step 220, the second set of quick connect couplings 132 of the third cooling distribution module 104c to the fluid exchange source, where the second set of quick connect couplings 132 comprise a supply valve 114 and a return valve 116 that are vertically disposed in parallel allowing the second supply valve 114 and the return valve 116 to be simultaneously connected to the fluid exchange source. The second set of quick connect couplings 132 and the connections of the fluid exchange source are unsealed allowing the second cooling fluid to flow between the fluid exchange source and the third cooling distribution unit 104*c*.

In one example, once the third cooling distribution module 104*c* is connected into the immersion cooling system 100, the third cooling distribution module 104*c* may be configured as a standby unit where the first cooling distribution module 104*a* continues to maintain the dielectric fluid temperature at or below a temperature threshold. In another example, the third cooling distribution module 104*c* may begin circulating the dielectric fluid through a third circulation pump, and the first cooling distribution module 104*a* may decrease the flow rate of the first circulation pump based on the detection of one of a plurality of conditions including a decrease in temperature, an increase in dielectric fluid flow, or a communication signal from a control module (e.g., the tank control module or the control module of the third cooling distribution module 104*c*). The plurality of conditions may indicate that the fault event has been resolved.

In one general aspect, therefore, the present invention is directed to a first embodiment for an appliance immersion cooling system comprising: a tank module comprising: a first control circuit; a plurality of connection lines comprising a sealing mechanism; and a tank for holding a dielectric fluid in which a plurality of electrical appliances is immersible; a plurality of cooling distribution modules, wherein each of the plurality of cooling distribution modules comprises: a second control circuit communicably couplable with the first control circuit; a circulation pump adapted to pump the dielectric fluid into the tank module such that the dielectric fluid circulates across the plurality of electrical appliances immersed in the tank; a first set of quick connect couplings, connectable to the plurality of connection lines of the tank module; and a second set of quick connect couplings, connectable to a secondary fluid exchange source, wherein the sealing mechanism of the tank module: prevents, when sealed, dielectric fluid from exiting the tank; and is sealable when a corresponding first set of quick connect couplings of one of the plurality of cooling distribution modules is disconnected from the tank module.

The first embodiment of the appliance immersion cooling system may include: the first set of quick connect couplings of a first cooling distribution module of the plurality of cooling distribution modules prevents a loss of the dielectric fluid out of the first cooling distribution module when the first cooling distribution module is disconnected from the tank module; the second set of quick connect couplings of the first cooling distribution module of the plurality of cooling distribution modules prevents a loss of a second heat dissipating fluid when of the first cooling distribution module is disconnected from the secondary fluid exchange source; and each of the plurality of cooling distribution modules further comprise: a heat exchanger configured to transfer heat from the dielectric fluid to the second heat dissipating fluid; an enclosure comprising a first inlet hole corresponding to a supply line of the tank module and a second inlet hole corresponding to a return line of the tank module; and a rolling mechanism.

The first embodiment of the appliance immersion cooling system may further include: the second set of quick connect couplings of a first cooling distribution module of the plurality of cooling distribution modules prevents a loss of a second heat dissipating fluid when of the first cooling distribution module is disconnected from the secondary fluid exchange source; wherein, for each of the plurality of cooling distribution modules, the first set of quick connect couplings comprise a supply valve and a return valve, such that the supply valve and the return valve are horizontally disposed on the plurality of cooling distribution modules, and wherein the supply valve and the return valve are simultaneously connectable to the plurality of connection lines of the tank module; wherein, for each of the plurality of cooling distribution modules, the second set of quick connect couplings comprise a supply valve and a return valve, such that the supply valve and the return valve are vertically disposed on the plurality of cooling distribution modules; wherein each of the plurality of cooling distribution modules further comprise: an enclosure comprising a first inlet hole corresponding to a supply line of the tank module and a second inlet hole corresponding to a return line of the tank module; and a rolling mechanism; wherein each of the plurality of cooling distribution modules further comprises a heat exchanger configured to transfer heat from the dielectric fluid to a second heat dissipating fluid; or wherein a first cooling distribution module of the plurality of distribution modules is configured to maintain a temperature of the dielectric fluid, wherein the temperature of the dielectric fluid does not exceed a predetermined temperature threshold while the first cooling distribution module is the only cooling distribution module connected to the tank module.

The first embodiment of the appliance immersion cooling system may further include: wherein each of the plurality of cooling distribution modules further comprises a heat exchanger configured to transfer heat from the dielectric fluid to a second heat dissipating fluid; and wherein the dielectric fluid and the second heat dissipating fluid are a different fluid type.

The first embodiment of the appliance immersion cooling system may further include: wherein the first control circuit controls a flow rate of the circulation pump in each of the plurality of cooling distribution modules based on a number of cooling distribution modules currently connected to the tank module; and wherein a first cooling distribution module of the plurality of cooling distribution modules operates as an active unit and a second cooling distribution module of the plurality of cooling distribution modules operates simultaneously as a standby unit, or a first cooling distribution module of the plurality of cooling distribution modules operates as a first non-zero flow rate and a second cooling distribution module of the plurality of cooling distribution modules operates simultaneously at a second non-zero flow rate, and wherein the first non-zero flow rate is greater than the second non-zero flow rate.

In another general aspect, the present invention is directed to a second embodiment for a cooling distribution module comprising: a circulation pump for pumping a dielectric fluid into a removably connectable tank module that holds one or more electrical appliances for cooling with the dielectric fluid; a heat exchanger; a first set of quick connect couplings, horizontally disposed in parallel, wherein the first set of quick connect couplings are connectable to the tank module and for carrying flow of the dielectric fluid into and out of the tank module; a second set of quick connect couplings, vertically disposed in parallel, wherein the second set of quick connect couplings are connectable to an secondary fluid exchange source for carrying flow of a heat dissipating fluid that is different from the dielectric fluid; and a control circuit for controlling flow of the dielectric fluid into the tank module.

The second embodiment of the cooling distribution module may further include: wherein the control circuit is further configured to: determine an operational status of the circulation pump; and transmit a fault notification to a communication medium associated with a technician, based on a determination that a failure event of the circulation pump; or wherein the first set of quick connect couplings comprise a supply valve and a return valve, wherein the supply valve and the return valve are simultaneously connectable to a plurality of connection lines of the tank module, and an enclosure with a first inlet hole and a second inlet hole, wherein a supply line of the plurality of connection lines is configured to pass through the first inlet hole and connect to the supply valve of the first set of quick connect couplings, and wherein a return line of the plurality of connection lines is configured to pass through the second inlet hole and connect to the return valve of the first set of quick connect couplings, or wherein the first set of quick connect couplings are configured to automatically seal when disconnected from the plurality of connection lines.

In yet another general aspect, the present invention is directed to a third embodiment for a method comprising: determining, by a first cooling distribution module in an immersion cooling system, a fault event in the immersion cooling system, wherein: the immersion cooling system comprises a tank module for holding one or more electrical appliances for cooling with a dielectric fluid; and the first cooling distribution module is one of a plurality of cooling distribution modules; increasing, by the first cooling distribution module, a flow rate of the dielectric fluid from the first cooling distribution module into the tank module by a first circulation pump of the first cooling distribution module based on the fault event; notifying, by a control circuit in the immersion cooling system, a technician of the fault event associated with a second cooling distribution module of the plurality of cooling distribution modules; disconnecting, by the technician, a second set of quick connect couplings of the second cooling distribution module, wherein the second set of quick connect couplings are associated with a secondary fluid exchange source; disconnecting, by the technician, a first set of quick connect couplings of the second cooling distribution module, wherein the first set of quick connect couplings are associated with the tank module; moving, by the technician, the second cooling distribution module out of a first position connectable with the tank module and the secondary fluid exchange source; moving, by the technician, a third cooling distribution module into the first position previously occupied by the second cooling distribution module; connecting, by the technician, the first set of quick connect couplings of the third cooling distribution module to the tank module; and connecting, by the technician, the second set of quick connect couplings of the third cooling distribution module to the secondary fluid exchange source; and comprising: increasing, by the third cooling distribution module, a flow rate of the dielectric fluid in a third circulation pump of the third cooling distribution module; decreasing, by the first cooling distribution module, the flow rate of the dielectric fluid in the first circulation pump of the first cooling distribution module based on the flow rate of the third circulation pump; and determining, by the control circuit in the immersion cooling system, a temperature of the dielectric fluid is less than or equal to a predetermined temperature threshold based on the flow rate of the first circulation pump and the third circulation pump.

The examples presented herein are intended to illustrate potential and specific implementations of the present invention. It can be appreciated that the examples are intended primarily for purposes of illustration of the invention for those skilled in the art. No particular aspect or aspects of the examples are necessarily intended to limit the scope of the present invention. Further, it is to be understood that the figures and descriptions of the present invention have been simplified to illustrate elements that are relevant for a clear understanding of the present invention, while eliminating, for purposes of clarity, other elements. While various embodiments have been described herein, it should be apparent that various modifications, alterations, and adaptations to those embodiments may occur to persons skilled in the art with attainment of at least some of the advantages. Persons skilled in the art will appreciate that recited operations therein may generally be performed in any order. Also, although various operational flow diagrams are presented in a sequence(s), it should be understood that the various operations may be performed in other orders than those which are illustrated, or may be performed concurrently. The disclosed embodiments are therefore intended to include all such modifications, alterations, and adaptations without departing from the scope of the embodiments as set forth herein.

What is claimed is:

1. A method comprising:
   determining, by a control circuit in an immersion cooling system, a fault event in the immersion cooling system, wherein the immersion cooling system comprises a tank module configured to immerse one or more electrical appliances in a dielectric fluid, a first cooling distribution module of a plurality of cooling distribution modules, and a second cooling distribution module of the plurality of cooling distribution modules;
   increasing, by the first cooling distribution module, a first flow rate of the dielectric fluid from the first cooling distribution module into the tank module by a first circulation pump of the first cooling distribution module based on the fault event;
   notifying, by the control circuit, a technician of the fault event;
   disconnecting, by the technician, a first set of quick connect couplings of the second cooling distribution module, wherein the first set of quick connect couplings are associated with the tank module;
   disconnecting, by the technician, a second set of quick connect couplings of the second cooling distribution module, wherein the second set of quick connect couplings are associated with a secondary fluid exchange source;
   moving, by the technician, the second cooling distribution module out of a first position connectable with the tank module and the secondary fluid exchange source;
   moving, by the technician, a third cooling distribution module into the first position previously occupied by the second cooling distribution module;
   connecting, by the technician, the first set of quick connect couplings of the third cooling distribution module to the tank module; and
   connecting, by the technician, the second set of quick connect couplings of the third cooling distribution module to the secondary fluid exchange source.

2. The method of claim 1, further comprising:

increasing, by the third cooling distribution module, a second flow rate of the dielectric fluid in a second circulation pump of the third cooling distribution module;

decreasing, by the first cooling distribution module, the first flow rate of the dielectric fluid in the first circulation pump of the first cooling distribution module based on the second flow rate of the second circulation pump; and determining, by the control circuit, a temperature of the dielectric fluid is less than or equal to a predetermined temperature threshold based on the first flow rate of the first circulation pump and the second flow rate of the second circulation pump.

3. The method of claim 1, further comprising:

automatically actuating, by the first set of quick connect couplings of the first cooling distribution module, a seal to avoid a loss of the dielectric fluid out of the first cooling distribution module when the first cooling distribution module is disconnected from the tank module.

4. The method of claim 1, further comprising:

controlling, by the control circuit, a flow rate of a circulation pump in each of the plurality of cooling distribution modules based on a number of cooling distribution modules connected to the tank module.

5. The method of claim 4, further comprising:

operating, by the first cooling distribution module, as an active unit circulating the dielectric fluid through the immersion cooling system; and operating, by the third cooling distribution module, as a standby unit.

6. The method of claim 4, wherein the first cooling distribution module circulates the dielectric fluid at a first non-zero flow rate and the third cooling distribution module simultaneously circulates the dielectric fluid at a second non-zero flow rate.

7. The method of claim 6, wherein the first non-zero flow rate is greater than the second non-zero flow rate.

8. The method of claim 1, further comprising:

operating, by the first cooling distribution module, as a first active unit circulating the dielectric fluid through the immersion cooling system; and operating, by the third cooling distribution module, as a second active unit circulating the dielectric fluid through the immersion cooling system.

9. The method of claim 8, wherein the first cooling distribution module circulates the dielectric fluid at a maximum flow rate and the third cooling distribution module simultaneously circulates the dielectric fluid at the maximum flow rate.

10. The method of claim 1, wherein the first set of quick connect couplings comprise a supply valve and a return valve.

11. The method of claim 10, wherein the supply valve and the return valve are simultaneously connectable to respective connection lines of the tank module.

12. The method of claim 11, wherein the plurality of cooling distribution modules comprise an enclosure with a first inlet hole and a second inlet hole, wherein a supply line of the plurality of connection lines is configured to pass through the first inlet hole and connect to the supply valve of the first set of quick connect couplings, and wherein a return line of the plurality of connection lines is configured to pass through the second inlet hole and connect to the return valve of the first set of quick connect couplings.

13. The method of claim 11, further comprising:

automatically sealing, by the first set of quick connect couplings of the second cooling distribution module, when the supply valve and the return valve are disconnected from the tank module; and automatically sealing, by the plurality of connection lines of the tank module, when the supply valve and the return valve are disconnected from the tank module.

14. A method comprising:

determining, by a control circuit in an immersion cooling system, a fault event associated with a first cooling distribution module in the immersion cooling system, wherein the immersion cooling system comprises a tank module configured to immerse one or more electrical appliances in a dielectric fluid, the first cooling distribution module of a plurality of cooling distribution modules, and a second cooling distribution module of the plurality of cooling distribution modules;

notifying, by the control circuit, a technician of the fault event associated with the first cooling distribution module;

disconnecting, by the technician, a first set of quick connect couplings of the first cooling distribution module, wherein the first set of quick connect couplings are associated with the tank module;

disconnecting, by the technician, a second set of quick connect couplings of the first cooling distribution module, wherein the second set of quick connect couplings are associated with a secondary fluid exchange source;

moving, by the technician, the first cooling distribution module out of a first position connectable with the tank module and the secondary fluid exchange source;

moving, by the technician, a third cooling distribution module into the first position previously occupied by the first cooling distribution module;

connecting, by the technician, the first set of quick connect couplings of the third cooling distribution module to the tank module; and connecting, by the technician, the second set of quick connect couplings of the third cooling distribution module to the secondary fluid exchange source.

15. The method of claim 14, further comprising:

maintaining, by the second cooling distribution module, a temperature of the dielectric fluid, wherein the temperature of the dielectric fluid does not exceed a predetermined temperature threshold while the second cooling distribution module is the only cooling distribution module connected to the tank module.

16. The method of claim 14, further comprising:

maintaining, by the second cooling distribution module, a temperature of the dielectric fluid, wherein the temperature of the dielectric fluid does not exceed a predetermined temperature threshold while the first cooling distribution module and the third cooling distribution module are disconnected from the tank module.

17. The method of claim 14, further comprising:

increasing, by the control circuit, a flow rate of the dielectric fluid from the second cooling distribution module into the tank module by a second circulation pump of the second cooling distribution module based on the fault event.

* * * * *